United States Patent
Yan et al.

(10) Patent No.: US 7,186,622 B2
(45) Date of Patent: Mar. 6, 2007

(54) FORMATION OF ACTIVE AREA USING SEMICONDUCTOR GROWTH PROCESS WITHOUT STI INTEGRATION

(75) Inventors: Jiang Yan, Fishkill, NY (US); Danny Pak-Chum Shum, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/891,540

(22) Filed: Jul. 15, 2004

(65) Prior Publication Data

US 2006/0014359 A1 Jan. 19, 2006

(51) Int. Cl.
*H01L 21/336* (2006.01)

(52) U.S. Cl. .................. 438/296; 438/424; 438/149

(58) Field of Classification Search ............ 438/413, 438/481
See application file for complete search history.

(56) References Cited

U.S. PATENT DOCUMENTS

| | | | |
|---|---|---|---|
| 3,476,991 A | 11/1969 | Mize et al. | |
| 3,612,960 A | 10/1971 | Takeishi et al. | |
| 3,634,737 A | 1/1972 | Maeda et al. | |
| 4,768,076 A | 8/1988 | Aoki et al. | |
| 4,857,986 A | 8/1989 | Kinugawa | |
| 4,878,957 A | 11/1989 | Yamaguchi et al. | |
| 5,384,473 A | 1/1995 | Yoshikawa et al. | |
| 5,593,915 A | 1/1997 | Ohoka | |
| 5,688,893 A | 11/1997 | Rahman et al. | |
| 5,994,188 A | 11/1999 | Disney | |
| 6,017,801 A | 1/2000 | Youn | |
| 6,436,748 B1 | 8/2002 | Forbes et al. | |
| 6,815,277 B2 | 11/2004 | Fried et al. | |
| 6,900,503 B2 | 5/2005 | Oh et al. | |
| 6,902,962 B2 | 6/2005 | Yeo et al. | |
| 6,967,132 B2 | 11/2005 | Gonzalez et al. | |
| 6,967,351 B2 | 11/2005 | Fried et al. | |
| 6,972,478 B1 | 12/2005 | Waite et al. | |
| 2004/0070045 A1* | 4/2004 | Suguro et al. ............ 257/506 |
| 2004/0082165 A1* | 4/2004 | Kuroi et al. ............... 438/637 |
| 2004/0121507 A1 | 6/2004 | Bude et al. | |
| 2004/0178452 A1 | 9/2004 | Miyasaka | |
| 2004/0195646 A1 | 10/2004 | Yeo et al. | |
| 2004/0253773 A1 | 12/2004 | Kang | |

FOREIGN PATENT DOCUMENTS

EP  0 852 416 A1  7/1998

OTHER PUBLICATIONS

Sheikh, F., et al., "The Impact of Device Orientation on Width-Quantized FinFET Circuits," EE 241 Spring 2004, pp. 1-6.

(Continued)

*Primary Examiner*—Dung A. Le
(74) *Attorney, Agent, or Firm*—Slater & Matsil, L.L.P.

(57) ABSTRACT

A semiconductor device can be formed without use of an STI process. An insulating layer is formed over a semiconductor body. Portions of the insulating layer are removed to expose the semiconductor body, e.g., to expose bare silicon. A semiconductor material, e.g., silicon, is grown over the exposed semiconductor body. A device, such as a transistor, can then be formed in the grown semiconductor material.

17 Claims, 3 Drawing Sheets

OTHER PUBLICATIONS

Yang, M., et al., "High Performance CMOS Fabricated on Hybrid Substrate With Different Crystal Orientations," IEEE, IEDM, 2003, pp. 453-456.

Yang, J., et al., "Edge Transistor Elimination in Oxide Trench Isolated N-Channel Metal-Oxide-Semiconductor Field Effect Transistors," 2001 American Vacuum Society, Feb. 5, 2001, pp. 327-332.

* cited by examiner

FORMATION OF ACTIVE AREA USING SEMICONDUCTOR GROWTH PROCESS WITHOUT STI INTEGRATION

TECHNICAL FIELD

The present invention relates generally to semiconductor devices and more particularly to the formation of an active area using a semiconductor growth process without STI integration.

BACKGROUND

Semiconductor integrated circuits include many devices formed on a semiconductor body, such as a substrate. These devices, such as transistors, are formed in active areas in the semiconductor body. The active areas are typically isolated from one another by insulating regions. For example, for semiconductor devices formed with dimensions greater than 0.5 μm typically use field oxide isolation, known as LOCOS. Smaller dimension integrated circuits, such as those of 0.25 μm and below, typically use shallow trench isolation (STI).

FIGS. 1a–1c illustrate a typical process for forming shallow trench isolated active areas 20. As shown in FIG. 1a, a semiconductor substrate 10 is provided. A masking layer 12, typically a combination of silicon nitride and oxide layers, is formed over the substrate 10. Openings 14 are formed in the masking layer 12 in the areas where the isolation will be formed. While not shown, standard photoresist lithography (e.g., using a hardmask for 90 nm and below) is used.

Referring now to FIG. 1b, trenches 16 are etched using the masking layer 12 as a mask. The portions 20 of the semiconductor substrate 10 adjacent the trenches 16 will be the active areas. Transistors and other devices can be formed in the active areas 20. As shown in FIG. 1c, the trenches 16 are filled with an insulating material in order to isolate the devices in the active areas from one another.

One issue for shallow trench isolation is the trench filling. A high density plasma (HDP) is widely used for this process. Many process conditions have been tried for optimization. As the top trench critical dimension (CD) is getting smaller, however, the HDP deposition is becoming very difficult due to voids that are formed. These issues only get worse as the CD goes from 90 nm and smaller and as the STI depth gets deeper for better isolation. A typical measurement is the aspect ratio (AR), which is defined as STI depth over CD width. Conventional wisdom is that oxide filling is getting more difficult as the AR goes above 3.

To avoid these problems, the main focus has been directed to modifying the process conditions and the combination of deposition and etch back. In other processes, low K dielectrics have been used due to their better reflow characteristics. The thinking is that better reflow characteristics will lead to better fill characteristics. Unfortunately, low k dielectrics have problems of their own.

Another problem with STI is that it involves many process steps: one masking step, one RIE, a liner oxide, fill, CMP and many cleans. A greater number of process steps leads to a higher cost. Therefore, a need has arisen for a lower cost process that avoids the problems of shallow trench isolation.

SUMMARY OF THE INVENTION

These and other problems are generally solved or circumvented, and technical advantages are generally achieved, by preferred embodiments of the present invention which provides for the formation of an active area using a semiconductor growth process.

In accordance with a preferred embodiment of the present invention, a semiconductor device is formed without use of an STI process. An insulating layer is formed over a semiconductor body. Portions of the insulating layer are removed to expose the semiconductor body, e.g., to expose bare silicon. A semiconductor material, e.g., silicon, is grown epitaxially over the exposed semiconductor body. A device, such as a transistor, can then be formed in the grown semiconductor material.

In accordance with another preferred embodiment of the present invention, a semiconductor device includes a semiconductor substrate and a number of active areas formed of semiconductor material and located above the semiconductor substrate. Each active area has an interface at the substrate where semiconductor material of the active area touches semiconductor material of the substrate. A plurality of isolation regions are disposed above the substrate and adjacent the active areas so that each active area is isolated from another active area by an isolation region. Transistors, or other devices, can be formed in the active areas.

An advantage of a preferred embodiment of the present invention is that with the elimination of the STI process, a number of complications can be avoided. For example, trench fill issues do not exist since the insulating layer is formed as a blanket layer. Further, there is no need to employ sublithography techniques or fill trenches with new dielectrics. The process of the preferred embodiment is simple and requires fewer steps than currently used isolation techniques.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a the formation of an active area using a semiconductor growth process without STI integration. In the preferred embodiment, the invention includes a silicon substrate over which a silicon layer is grown and serves as the active areas for device formation. As discussed below, the invention may also be applied to other materials and substrates.

Figure 2A:
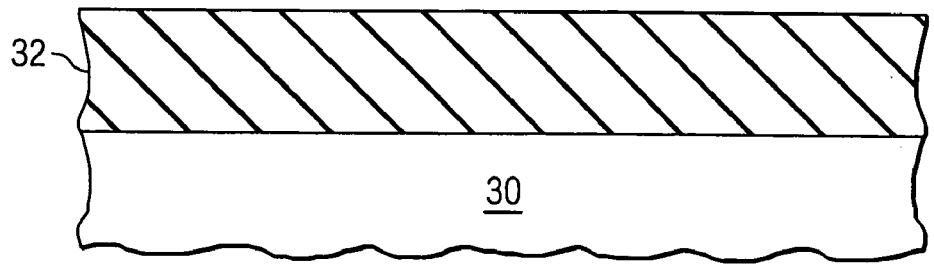
FIGS. 2a–2f are cross-sectional views of a process flow of the preferred embodiment.

FIGS. 2a–2f show cross-sectional views of an exemplary process flow that will be used to describe the steps of the preferred embodiment of the invention. Referring first to FIG. 2a, a semiconductor body 30 is provided. In the preferred embodiment, the semiconductor body comprises a monocrystalline silicon substrate. In other embodiments, other semiconductors such as germanium, silicon-germanium, gallium arsenide (and others) can be used. Further, the semiconductor body 30 can be a bulk substrate, a layer over a substrate (e.g., an silicon-on-insulator or epitaxially grown layer), or a region within a layer (e.g., a well or a tub).

An insulating layer 32 is formed over the semiconductor body 30. In the preferred embodiment, an oxide layer is deposited. For example, silicon dioxide can be deposited by high density plasma deposition, chemical vapor deposition, the decomposition of tetraethyloxysilane (TEOS) or other processes. Thermally grown oxides are also possible. The oxide can be a doped material such as borophosphosilicate glass (BPSG), boron silicate glass (BSG), phosphosilicate glass (PSG), or fluorinated silicate glass (FSG), as examples. Materials other than oxides can also be used. For example insulating layer 32 can be a nitride, an oxynitride, or a high dielectric constant (high k) material (e.g., $Ta_2O_5$, $HfO_2$, or HfSiON). Preferably, a high k material has a dielectric constant greater than about 5 (where the dielectric constant of a vacuum is 1). While illustrated as a single layer, it is understood that multilayer dielectric structures could equally be used.

Figure 2B:
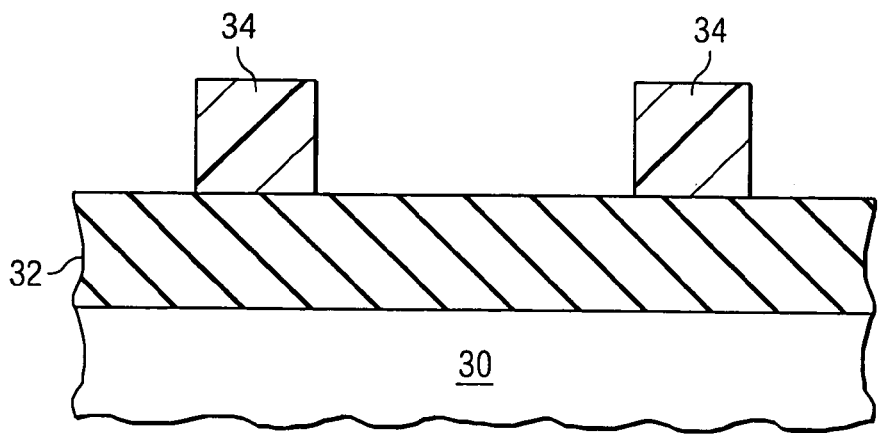
Figure 2C:
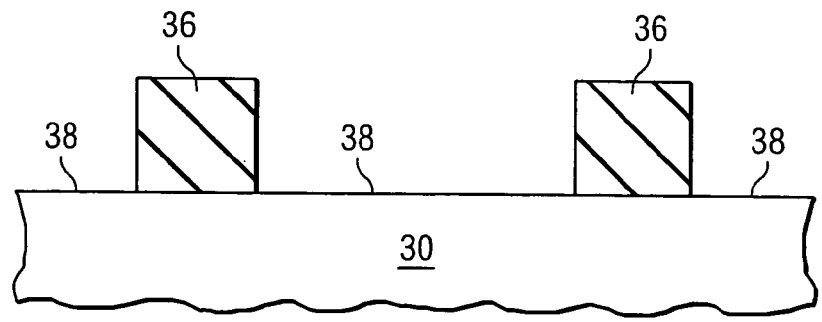

Referring next to FIG. 2b, a photoresist layer 34 is deposited and patterned using standard photolithography techniques. Either positive or negative resists can be used. The mask 34 will be patterned so as to cover the portions of the insulating layer 32 that will become the insulating regions 36. FIG. 2c shows the structure after the etching is performed and the photoresist 34 is removed. At this stage, it is preferable that bare silicon from substrate 30 be exposed. The insulating layer 32 is preferably etched using a reactive ion etching process. The exposed portions 38 will serve as the seed layer for the growth of the active areas, which is illustrated in FIG. 2d.

Figure 2D:
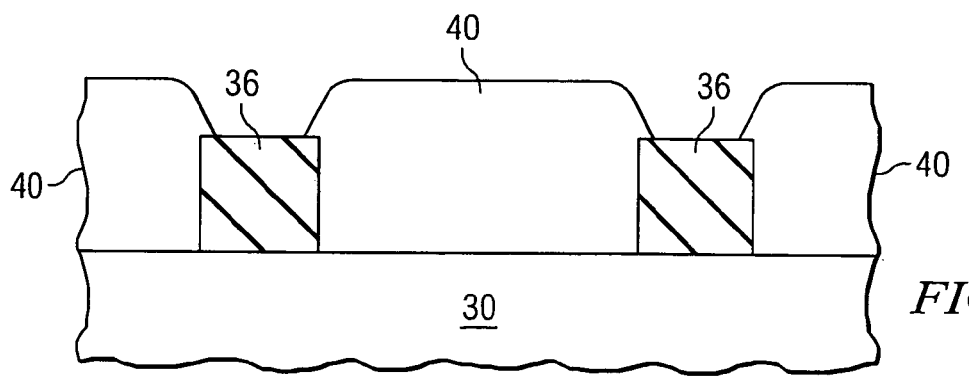

Referring now to FIG. 2d, silicon layer 40 is grown over the exposed portions 38 of semiconductor body 30 to completely fill the trenches between the insulating regions 36. In the preferred embodiment, an epitaxial growth technique is used.

In the preferred embodiment, a silicon layer 40 is grown over a silicon body 30. In this case, the semiconductor material of the body 30 is the same as the semiconductor material of the grown layer 40. In other embodiments, however, this need not be the case. For example, to form a strained semiconductor layer, a layer of silicon can be grown over a silicon-germanium body 30. e.g., a silicon germanium substrate or a silicon-germanium layer over a substrate. In other examples, other combinations of materials are possible.

In the preferred embodiment, the insulating layer 32 was formed to a thickness of between about 100 nm and 500 nm, preferably about 300 nm. In other embodiments, the thickness can be greater (e.g., up to about 2000 nm) or thinner (e.g., down to about 10 nm). The silicon layer 40 is preferably grown to about this same thickness. In a less preferred embodiment, the silicon 40 can be grown above the level of the insulator 36 and a further insulator deposition (not shown) can be performed to fill the regions over the insulator 36.

Figure 2E:
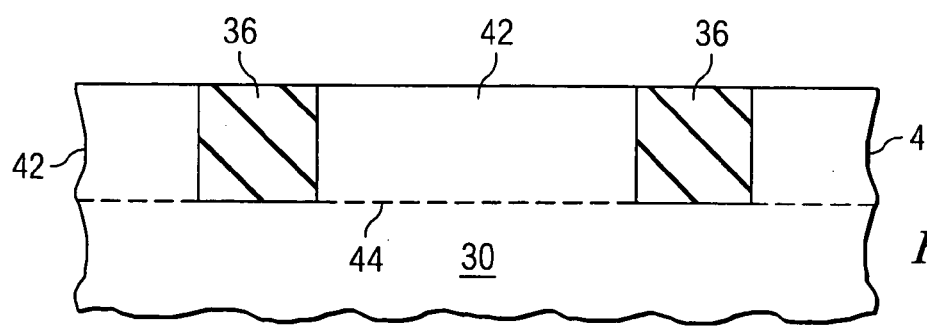

Referring now to FIG. 2e, the top surface of the silicon layer 40 is planarized to be substantially planar with the top surface of insulating regions 36. The portions 42 of the silicon layer 40 that remain between the insulating regions 36 can be used as active areas. While it is preferable that the active areas 42 and insulating regions 36 are co-planar, this is not required. The planarization step is preferably performed using a chemical-mechanical polish (CMP). Other planarization techniques, such as etch back, can alternatively be used. In an alternate embodiment, a thermal oxide (not shown) can be grown over the active area 42 and then removed to get a fresh silicon surface.

Figure 3:
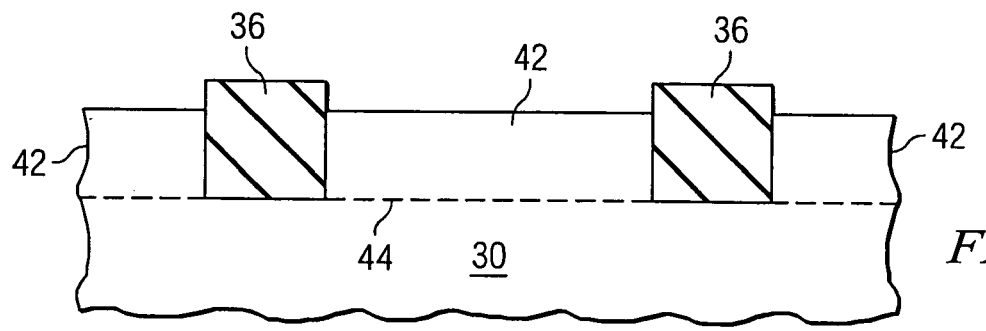
FIG. 3 illustrates a alternative structure.

In an alternate embodiment, which is illustrated in FIG. 3, the silicon layer 40 is grown to thickness less than that of the insulator 36. This process can be used to avoid the planarization step shown in FIG. 2e. The difference in height will be limited by the capability of later insulator deposition processes to fully cover the topography of the structure. FIG. 3 illustrates but one example of how the top surface of active area 42 is not co-planar with the top surface of insulating region 36. For example, the step height can be similar to that achieved after the standard STI process.

Figure 1A:
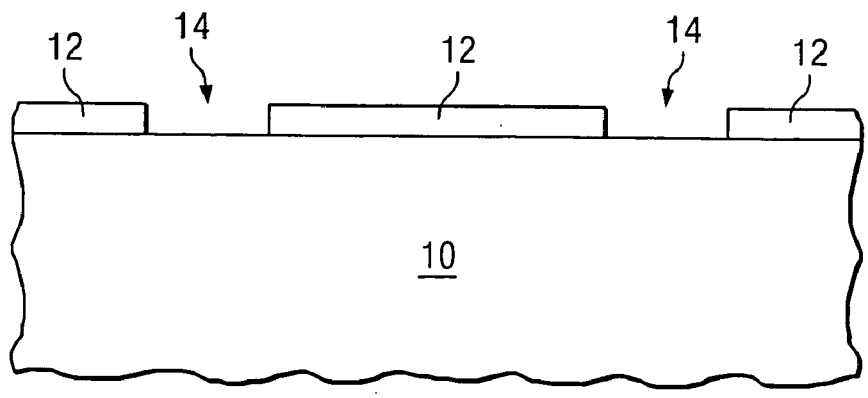
FIGS. 1a–1c are cross-sectional views of a conventional process flow.
Figure 1B:
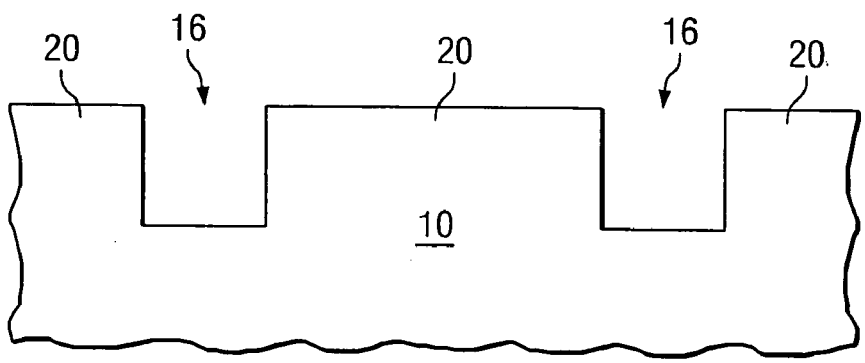
Figure 1C:
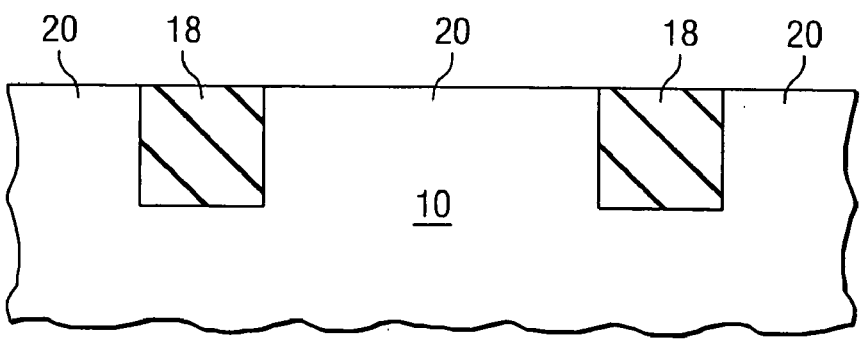

Comparing the structure of FIG. 2e with that of FIG. 1c, it is seen that the active areas 42 of the present invention can be used in the same manner as active areas 20 of the prior art. Unlike the structure of FIG. 1c, the embodiment of FIG. 2e will include an interface 44 between the semiconductor body 30 and the active areas 42. Preferably, a high quality film 40 was grown and as a result the interface should be minimized (e.g., the grown film 40 and the substrate 30 should appear to be a single layer). As such, it is preferable that the interface 44 between the substrate 30 and active area 42 be undetectable in a cross-sectional view, e.g., using a TEM or SEM micrograph. Certainly, however, the interface 44 will be detectable if the substrate 30 and active area 42 are formed from different materials.

The interface between the semiconductor body 30 and the insulating region 36, however, will be very smooth compared to the interface between the STI insulator 18 and the substrate 20 of FIG. 1c. In the prior art, the trench 16 is etched and, as a result, a smooth interface is not possible. In the embodiment of FIG. 2, on the other hand, no trench is ever etched into the substrate and therefore a smoother interface is possible.

Figure 2F:
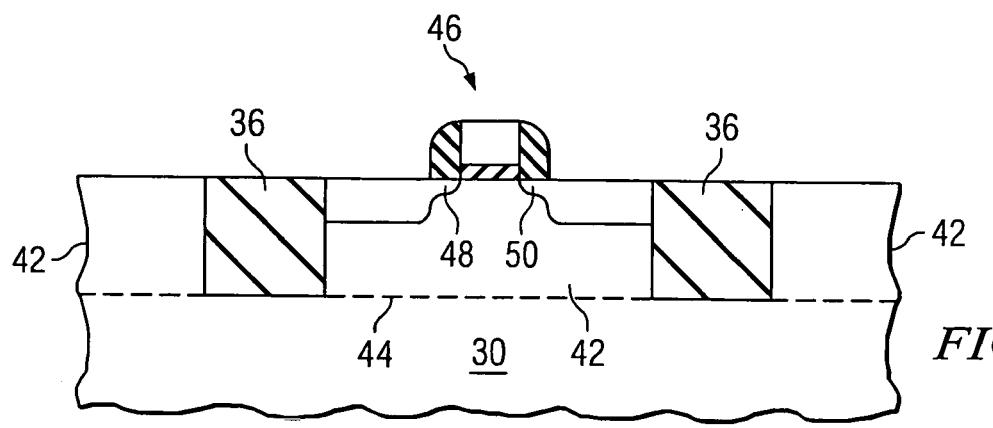

FIG. 2f is provided to illustrate a device 46, in this case a MOS transistor, that is formed in the active area 42. In a typical embodiment, many transistors (e.g., thousands or millions) are formed on a single chip. In the case of a CMOS device, some of the active areas 42 are doped with n-type impurities and others of the active areas are doped with p-type impurities. As is known in the art, n-channel transistors are formed in the p-doped active areas and p-channel transistors and formed in the n-doped active areas. In an alternative embodiment, other types of devices such as bipolar transistors, capacitors and resistors, as examples, are formed in and above the active areas 42.

As noted above, the device 46 that is illustrated in FIG. 2f is a MOS transistor. As is known in the art, an MOS transistor 46 includes a source region 48 and a drain region 50 disposed within the semiconductor material of the active area 42 and a gate electrode 52 disposed over the semiconductor material of the active area 42. The transistor can formed using known processing steps. Other MOS transistors, e.g., with a buried gate, can also be used.

As illustrated by the example above, aspects of the present invention help to solve problems associated with STI formation by forming active areas by use of selective silicon epitaxy. In this example, no trench filling is needed because the silicon for the active area grows up directly from the substrate. With this embodiment, the total number of process steps can be reduced by fifty percent.

Figure 4A:
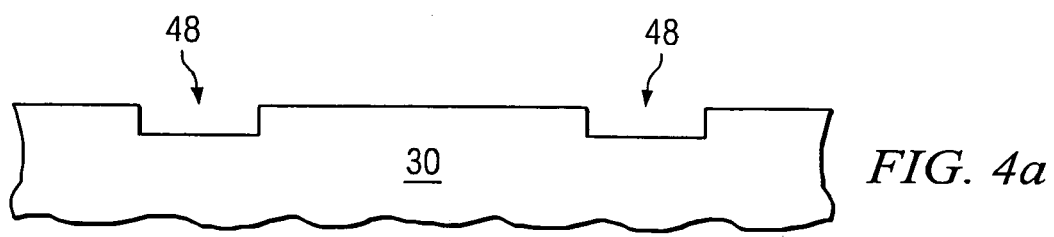
FIGS. 4a–4b show alternative embodiment process steps.
Figure 4B:
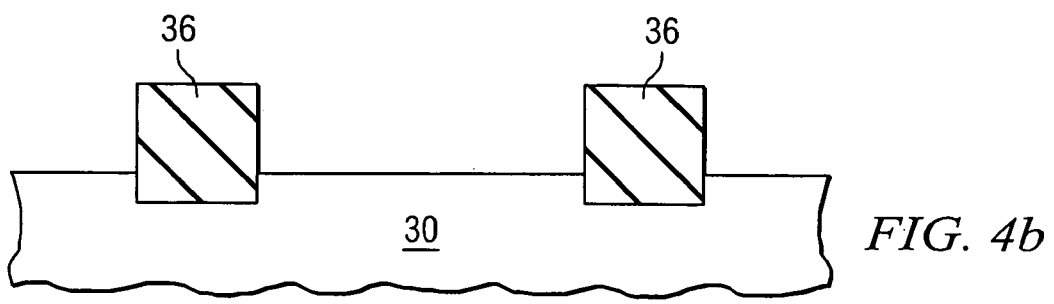

FIGS. 4a and 4b illustrate an alternate embodiment where a shallow recess 48 is formed in the semiconductor body 30 before the insulating layer 32 is formed. FIG. 4a shows the semiconductor body with recesses 48 and FIG. 4b shows the structure after the insulating 32 has been etched (i.e., at the same point in the process as is illustrated in FIG. 2c). This alternate embodiment is less preferred because additional masking and etching steps are required to form the recesses 48.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
   providing a semiconductor body having a top surface;
   forming recesses in said top surface of said semiconductor body;
   formning an insulating layer over the semiconductor body, said insulating layer filling said recesses;
   removing portions of the insulating layer to expose said top surface of the semiconductor body, between said recesses and to define remaining portions of said insulating layer, said remaining portions of said insulating layer extending to a selected thickness above said top surface of said semiconductor body;
   growing a semiconductor material over the exposed top surface of said semiconductor body and between said remaining portions;
   bridging an interface formed between the semiconductor body and the semiconductor material grown over said semiconductor body with said remaining portions of said insulating layer; and
   forming a device in the grown semiconductor material.

2. The method of claim 1 wherein providing a semiconductor body comprises providing a bare silicon substrate.

3. The method of claim 1 wherein forming an insulating layer comprises forming an oxide layer.

4. The method of claim 1 wherein the insulating layer comprises a high k dielectric layer.

5. The method of claim 1 wherein the material of the semiconductor body is the same material as the semiconductor material.

6. The method of claim 1 wherein removing portions of the insulating layer comprises etching a plurality of trenches in the insulating layer between a pair of said recesses, and wherein growing a semiconductor material comprises completely filling the trenches.

7. The method of claim 6 and further comprising planarizing a top surface of the filled trench.

8. The method of claim 1 and further comprising:
   depositing a photoresist over the insulating layer; and
   patterning the photoresist with a mask;
   wherein removing portions of the insulating layer comprises etching the insulating layer using the photoresist as a mask.

9. The method of claim 1 wherein growing a semiconductor material comprises performing a selective epitaxial process.

10. The method of claim 1 wherein forming a device comprises forming a transistor.

11. The method of claim 10 wherein forming a device comprises forming a MOS transistor.

12. A method of forming a semiconductor device without using a shallow trench isolation process, the method comprising:
    forming a plurality of recesses in a top surface of a silicon body;
    forming an insulating layer over said top surface of said silicon body, said insulating layer filling said recesses;
    etching a plurality of trenches in the insulating layer and to define remaining portions of said insulating layer, each of said trenches extending to the semiconductor body so as to expose portions of the top surface of said silicon body, between two adjacent ones of said plurality of said recesses, and said remaining portions extending a selected thickness above said top surface of said silicon body;
    epitaxially growing silicon to fill the trenches, defined by said remaining portions;
    bridging an interface formed between the silicon body and the silicon epitaxially grown over said silicon body with said remaining portions of said insulating layer; and
    planarizing a top surface of the filled trenches.

13. The method of claim 12 and further comprising forming a transistor device in one of the silicon filled trenches.

14. The method of claim 12 wherein forming an insulating layer comprises forming an oxide layer.

15. The method of claim 14 wherein forming an insulating layer comprises depositing an oxide using a high density plasma process.

16. The method of claim 14 wherein forming an insulating layer comprises depositing an oxide using a TEOS precursor gas.

17. The method of claim 14 wherein forming an insulating layer comprises forming a nitride layer.

* * * * *

UNITED STATES PATENT AND TRADEMARK OFFICE
CERTIFICATE OF CORRECTION

PATENT NO. : 7,186,622 B2 Page 1 of 1
APPLICATION NO. : 10/891540
DATED : March 6, 2007
INVENTOR(S) : Yan et al.

It is certified that error appears in the above-identified patent and that said Letters Patent is hereby corrected as shown below:

TITLE PAGE,
ITEM 56; insert --3,603,848 A 9/1971 Sato, et al.--
ITEM 56; insert --6,294,803 B1 9/2001 Gil--
Column 5, line 24; delete "formning" insert --forming--

Signed and Sealed this

First Day of May, 2007

JON W. DUDAS
*Director of the United States Patent and Trademark Office*